(12) United States Patent
Baliga

(10) Patent No.: US 6,303,410 B1
(45) Date of Patent: Oct. 16, 2001

(54) METHODS OF FORMING POWER SEMICONDUCTOR DEVICES HAVING T-SHAPED GATE ELECTRODES

(75) Inventor: Bantval Jayant Baliga, Raleigh, NC (US)

(73) Assignee: North Carolina State University, Raleigh, NC (US)

( * ) Notice: Subject to any disclaimer, the term of this patent is extended or adjusted under 35 U.S.C. 154(b) by 0 days.

(21) Appl. No.: 09/547,544

(22) Filed: Apr. 12, 2000

Related U.S. Application Data

(62) Division of application No. 09/088,276, filed on Jun. 1, 1998.

(51) Int. Cl.[7] ............................. H01L 21/332
(52) U.S. Cl. ................ 438/138; 438/135; 438/137; 438/542; 438/546; 438/547; 438/556
(58) Field of Search ..................... 438/133, 135, 438/138, 136, 137, 542, 546, 547, 556

(56) References Cited

U.S. PATENT DOCUMENTS

| | | | |
|---|---|---|---|
| 5,178,370 | * 1/1993 | Clark et al. ................ | 257/212 |
| 5,326,711 | 7/1994 | Malhi ........................ | 437/33 |
| 5,366,914 | 11/1994 | Takahshi et al. ........... | 437/41 |
| 5,397,728 | * 3/1995 | Sasak et al. . | |
| 5,412,228 | 5/1995 | Baliga ....................... | 257/141 |
| 5,623,152 | 4/1997 | Majiumdar et al. ........ | 257/330 |
| 5,637,898 | 6/1997 | Baliga ....................... | 257/330 |
| 5,693,569 | 12/1997 | Ueno ......................... | 437/203 |
| 5,714,781 | 2/1998 | Yamamoto et al. ......... | 257/330 |
| 5,742,076 | 4/1998 | Sridevan et al. ............ | 257/77 |
| 5,766,967 | 6/1998 | Lai et al. .................... | 437/415 |
| 5,770,514 | 6/1998 | Matsuda et al. ............ | 438/589 |
| 5,770,525 | 6/1998 | Kamiyama .................. | 438/745 |
| 5,811,843 | 9/1998 | Yamamoto et al. ......... | 257/194 |
| 5,834,817 | 11/1998 | Satoh et al. ................ | 257/387 |
| 5,856,232 | 1/1999 | Yang et al. ................. | 438/574 |
| 5,858,824 | 1/1999 | Saitoh ........................ | 438/167 |

(List continued on next page.)

OTHER PUBLICATIONS

Sorab Ghandi, "VLSI Fabrication Principles," John Wiley & Sons, 1983, pp. 430–432.

*Primary Examiner*—Long Pham
(74) *Attorney, Agent, or Firm*—Myers Bigel & Sibley & Sajovec

(57) ABSTRACT

Power semiconductor devices having recessed gate electrodes are formed by methods which include the steps of forming a semiconductor substrate having a drift region of first conductivity type therein extending to a face thereof and forming a trench in the substrate so that the trench has a bottom which extends opposite the drift region and a sidewall which extends from the drift region to the face. The sidewall may extend orthogonal to the face or at an angle greater than 90°. A preferred insulated gate electrode is formed by lining the face and trench with a gate electrode insulating layer and then forming a conductive layer on the gate electrode insulating layer. The conductive layer is preferably formed to extend opposite a portion of the face adjacent to the trench and into the trench. A step is then performed to pattern the conductive layer to define a T-shaped or Y-shaped gate electrode which fills the trench and also extends opposite the face at a location adjacent the trench. This step is preferably performed without planarizing the conductive layer using techniques such as chemical mechanical polishing (CMP). Emitter/source and base regions of first and second conductivity type, respectively, are then formed in the drift region. Preferably, the emitter/source regions are formed in a self-aligned manner to an edge of the patterned gate electrode. In particular, the emitter/source region and base region may be formed by implanting emitter/source and base region dopants into the drift region, using the gate electrode as an implant mask, and then diffusing the implanted dopants to define an emitter/source region within a base region well.

12 Claims, 5 Drawing Sheets

U.S. PATENT DOCUMENTS

| | | | |
|---|---|---|---|
| 5,877,527 | 3/1999 | Okabe et al. | 257/330 |
| 5,894,149 | 4/1999 | Uenishi et al. | 257/331 |
| 5,895,941 | 4/1999 | Kitano | 257/194 |
| 5,895,946 | 4/1999 | Hamamoto et al. | 257/302 |
| 5,907,177 | 5/1999 | Uda et al. | 257/412 |
| 5,976,936 | 11/1999 | Miyajima et al. | 438/268 |
| 5,986,304 | 11/1999 | Hshieh et al. | 257/330 |
| 6,153,473 * | 11/2000 | Calafut et al. | 438/268 |

* cited by examiner

METHODS OF FORMING POWER SEMICONDUCTOR DEVICES HAVING T-SHAPED GATE ELECTRODES

This application is a Division of Ser. No. 09/088,276 filed Jun. 1, 1998.

FIELD OF THE INVENTION

The present invention relates to power semiconductor devices and methods of forming same and more particularly, to power semiconductor devices having trench-based gate electrodes and methods of forming same.

BACKGROUND OF THE INVENTION

The development of semiconductor switching technology for high power applications in motor drive circuits, appliance controls and lighting ballasts, for example, began with the bipolar junction transistor. As the technology matured, bipolar devices became capable of handling large current densities in the range of 40–50 A/cm$^2$, with blocking voltages of 600 V. Despite the attractive power ratings achieved by bipolar transistors, there exist several fundamental drawbacks to the suitability of bipolar transistors for all high power applications. First of all, bipolar transistors are current controlled devices and a large control current into the base, typically one fifth to one tenth of the collector current, may be required to maintain the device in an operating mode. Even larger base currents, however, are typically required for high speed forced turn-off. These characteristics make the base drive circuitry complex and expensive. The bipolar transistor may also be vulnerable to breakdown if a high current and high voltage are simultaneously applied to the device, as commonly required in inductive power circuit applications, for example. Furthermore, it may be difficult to parallel connect these devices since current diversion to a single device may occur at high temperatures, making emitter ballasting schemes necessary.

The power MOSFET was developed to address this base drive problem. In a power MOSFET, a gate electrode bias is applied for turn-on on and turn-off control. Turn-on occurs when a conductive inversion-layer channel is formed in series between the MOSFET's source and drain regions under appropriate bias. The gate electrode is separated from the device's active area by an intervening gate insulator, typically silicon dioxide. Because the gate is insulated from the active area, little if any gate current is required in either the on-state or off-state. The gate current is also kept small during switching because the gate forms a capacitor with the device's active area. Thus, only charging and discharging current ("displacement current") is required. The high input impedance of the gate, caused by the presence of the gate insulator, is a primary feature of the power MOSFET. Moreover, because of the minimal current demands on the gate, the gate drive circuitry can be easily implemented on a single chip. As compared to bipolar technology, the simple gate control typically provides for a large reduction in cost and a significant improvement in reliability. These benefits may be offset, to some extent, by the typically high on-state resistance of the MOSFET's active region, which arises from the absence of minority carrier injection. As a result, a power MOSFET's operating forward current density may be limited to relatively low values, typically in the range of 10 A/cm$^2$, for a 600 V device, as compared to 40–50 A/cm$^2$ for the bipolar transistor.

Because of these features of bipolar transistors and MOSFETs, hybrid devices which combine bipolar current conduction characteristics with MOS-controller current flow were developed and found to provide significant advantages over single technologies such as bipolar or MOSFET alone. One example of a hybrid device is the insulated-gate bipolar transistor (IGBT). The IGBT combines the high impedance gate of the power MOSFET with the small on-state conduction losses of the power bipolar transistor. An added feature of the IGBT is its ability to block both forward and reverse bias voltages. One embodiment of an IGBT is disclosed in an article by inventor B. J. Baliga and M. S. Adler, R. P. Love, P. V. Gray and N. Zommer, entitled *"The Insulated Gate Transistor: A New Three Terminal MOS Controlled Bipolar Power Device,"* IEEE Trans. Electron Devices, ED-31, pp. 821–828 (1984), the disclosure of which is hereby incorporated herein by reference. Based on experimental results, on-state losses were shown to be greatly reduced when compared to power MOSFETs. This was caused by conductivity modulation within the IGBT's drift region during on-state conduction. Moreover, very high conduction current densities in the range of 200–300 A/cm$^2$ were also achieved. Accordingly, an IGBT can be expected to have a conduction current density approximately 20 times that of a power MOSFET and five (5) times that of an equivalent bipolar transistor. Typical turn-off times for IGBTs can also be in the range of 10–50 $\mu$s. These and other aspects of IGBTs are more fully described in U.S. Pat. No. 5,412,228 to Baliga, entitled "Multifunctional Semiconductor Switching Devices Having Gate-Controlled Regenerative and Non-Regenerative Conduction Modes, and Methods of Operating Same", assigned to the present assignee, the disclosure of which is hereby incorporated herein by reference.

The basic structure of a DMOS-based IGBT is shown in cross-section in FIG. 1A. In the IGBT, forward conduction can occur by positively biasing the collector with respect to the emitter and applying a positive gate bias of sufficient magnitude to invert the surface of the P-base region under the gate. By creating an inversion layer in the P-base region, electrons are allowed to flow from the N+ emitter region into the N-type drift region (shown as N−). In this forward conducting state, the junction J2 is forward biased and the P+ collector region injects holes into the drift region. As the forward bias across the collector/drift region junction is increased, the injected hole concentration increases until it exceeds the background doping level in the drift region. In this regime of operation, the device operates like a forward-biased P-i-N diode with heavy conductivity modulation of the N-type drift region. Accordingly, the IGBT can operate at high current densities even when designed for operation at high blocking voltages. As long as the gate bias is sufficiently large to produce enough inversion layer charge for providing electrons into the drift region, the IGBT forward conduction characteristics will look like those of a P-i-N diode. However, if the inversion layer conductivity is low, a significant voltage drop will begin to appear across this region like that observed in conventional MOSFETs. At this point, the forward current will saturate and the device will operate in its active or current saturation region, as shown in FIG. 1B. Referring now to FIG. 1C, the basic structure of a DMOS-based FET is illustrated. The illustrated DMOS FET is similar to the IGBT of FIG. 1A, however, N-type drain and source regions replace the P-type collector and N-type emitter regions, respectively.

Due to the strong depletion region pinch-off effect (i.e., "JFET effect") between the adjacent P-base regions in the devices of FIGS. 1A and 1C, a selective implant step is typically performed to increase the doping concentration in the upper portion of the drift region commonly referred to as the "neck" region. Thus, after implant, respective "JFET" regions are formed between adjacent P-base regions. In the case of high voltage IGBTs fabricated using very lightly doped drift regions, the JFET effect can lead to an undesirable snap-back in the on-state characteristics unless the JFET implant has sufficient dose. However, too large a JFET implant dose can result in a degradation in the forward blocking voltage characteristics of the device. Accordingly, attempts have been made to form IGBTs and related devices which do not require the formation of JFET regions to prevent parasitic snap-back.

In particular, FIG. 2 illustrates a conventional IGBT structure which has an insulated-gate electrode within in trench. Such devices have been shown to have superior on-state characteristics due to an enhancement in the hole/electron distribution profile in the drift region. The trench-based IGBT of FIG. 2 can be fabricated by using conventional DMOS processing techniques, as illustrated by the process flow diagram of FIG. 3. Preferred techniques to form trench-based power devices are also described in U.S. Pat. Nos. 5,742,076 to Sridevan et al., entitled "Silicon Carbide Switching Devices Having Near Ideal Breakdown Voltage Capability and Ultralow On-State Resistance"; and. U.S. Pat. No. 5,637,898 to Baliga, entitled "Vertical Field Effect Transistors Having Improved Breakdown Voltage Capability and Low On-State Resistance", assigned to the present assignee, the disclosures of which are hereby incorporated herein by reference.

Referring now to FIGS. 2–3, conventional techniques for forming DMOS-based devices having trench gate electrodes, Block 100, typically include the steps of forming a semiconductor substrate containing a relatively lightly doped drift region extending to a surface thereof, Block 102. This substrate may comprise a P-type substrate (shown as P+) and a buffer layer (shown as N+) may be provided between the P-type substrate and the drift region (shown as N−). As will be understood by those skilled in the art, the buffer layer is provided to inhibit reach-through breakdown. Steps are then performed to selectively implant dopants of first and second conductivity type into the drift region and then diffuse the implanted dopants to form an emitter/source region within a base region well (shown as P-base), Block 104. A more highly doped base contact region (not shown) may also be formed in the base region so that majority carriers (e.g., holes) collected by the base region can be provided to an emitter electrode. Next, an photolithographically defined etching can be performed to etch through the emitter/source region and base region to define a trench in the substrate, Block 106. This series of steps is also illustrated by FIGS. 2A–2C of the aforementioned '898 patent. Then, with respect to Block 108, an insulated gate electrode is formed in the trench. This insulated gate electrode may be formed by depositing a gate insulating layer (e.g., SiO$_2$ layer) on the surface of the substrate and in the trench, and then depositing a blanket layer of polycrystalline silicon ("polysilicon") on the deposited gate insulating layer. As will be understood by those skilled in the art, the channel length of the device is determined by the vertical distance between the diffused emitter/source region and the diffused base region, as measured along a sidewall of the trench. In other words, the channel length equals the distance between the emitter/base region P-N junction and the base region/drift region P-N junction. Next, a planarization step, using such techniques as chemical-mechanical polishing (CMP), is performed to expose the base and emitter/source regions at the surface, Block 110. Contacts are then made to the exposed base and emitter regions, Block 112.

Unfortunately, these steps typically used to fabricate trench-based devices are more complex than those for the conventional planar DMOS process. In addition to the need to form vertically walled trenches having small trench width (for high integration levels), it is essential to fill the trench without voids in the polysilicon and then planarize the polysilicon to expose the base and emitter/source regions. However, the planarization step is typically the yield limiting step because the top surface of the polysilicon must not only lie below the surface of the substrate, but also above the bottom edge of the emitter/source region diffusion at the P-N junction with the base region. Yet, because of the small depth of the emitter/source region (typically less than 1 $\mu$m), the precision and uniformity requirements associated with the planarization step will likely limit yield.

Thus, notwithstanding these attempts to form power devices such as DMOS-based FETs and IGBTs, there continues to be a need for improved methods of forming power devices which are less susceptible to yield-limiting process steps such as planarization.

SUMMARY OF THE INVENTION

It is therefore an object of the present invention to provide improved power semiconductor devices, and methods of forming same.

It is another object of the present invention to provide methods of forming power semiconductor devices which do not require yield limiting fabrication steps such as planarization steps, and devices formed thereby.

It is a further object of the present invention to provide methods of forming power semiconductor devices which have superior on state characteristics caused by an enhancement in the hole/electron distribution profile in the drift region, and devices formed thereby.

These and other objects, advantages and features of the present invention are provided by methods of forming power semiconductor devices which include the steps of forming a semiconductor substrate having a drift region of first conductivity type (e.g., N-type) therein extending to a face thereof and forming a trench in the substrate so that the trench has a bottom which extends opposite the drift region and a sidewall which extends from the drift region to the face. The sidewall may extend orthogonal to the face or at an angle greater than 90°. A preferred insulated gate electrode is formed by lining the face and trench with a gate electrode insulating layer (e.g., SiO$_2$ layer) and then forming a conductive layer on the gate electrode insulating layer. The conductive layer is preferably formed to extend opposite a portion of the face adjacent to the trench and into the trench. A step is then performed to pattern the conductive layer to define a T-shaped or Y-shaped gate electrode which fills the trench and also extends opposite the face at a location adjacent the trench. This patterning step is preferably performed without planarizing the conductive layer using techniques such as chemical mechanical polishing (CMP). Emitter/source and base regions of first and second conductivity type, respectively, are then formed in the drift region. Preferably, the emitter/source and base regions are formed in a self-aligned manner to an edge of the patterned gate electrode. In particular, the emitter/source region and base region may be formed by implanting emitter/source and base region dopants into the drift region, using the gate electrode as an implant mask, and then diffusing the implanted dopants to define an emitter/source region within a base region well. The diffusion step may also be of sufficient duration to diffuse the base region dopants laterally to the sidewall of the trench. Thus, the application of a gate bias of sufficient magnitude to the gate electrode may result in the formation of an inversion layer channel which extends along the interface between the face of the substrate and the base region and also along the interface between the sidewall of the trench and the lateral portion of the base region which contacts the sidewall of the trench.

According to another embodiment of the present invention, preferred semiconductor switching devices are provided. These devices comprise a semiconductor substrate having a drift region of first conductivity type therein extending adjacent a face thereof. A trench is also provided in the substrate. The trench has a bottom and sidewall which extend opposite the drift region. A gate electrode insulating layer is also provided on the substrate. The gate electrode insulating layer preferably lines the trench and extends opposite a first portion of the face adjacent the trench. A gate electrode is provided on the gate electrode insulating layer. The gate electrode extends into the trench and opposite the first portion of the face. The gate electrode may be formed to have a T-shaped or Y-shaped cross-section. Emitter/source and base regions of first and second conductivity type, respectively, are also provided in the drift region. These emitter/source and base regions are preferably self-aligned to the gate electrode.

DESCRIPTION OF PREFERRED EMBODIMENTS

Figure 1A:
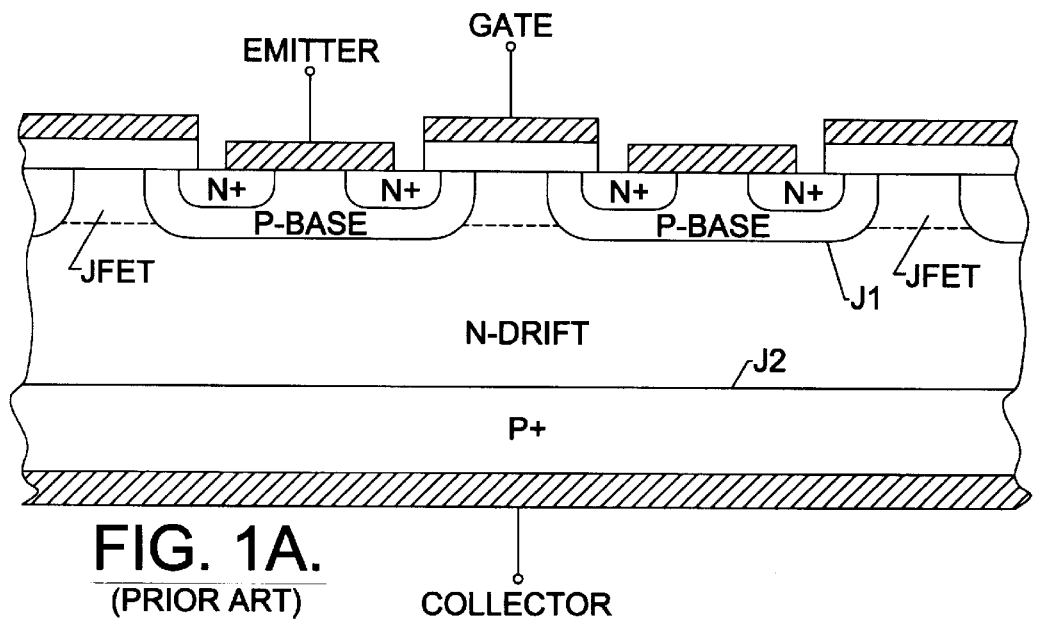
FIG. 1A is a cross-sectional view of a conventional insulated-gate bipolar junction transistor (IGBT).
Figure 1B:
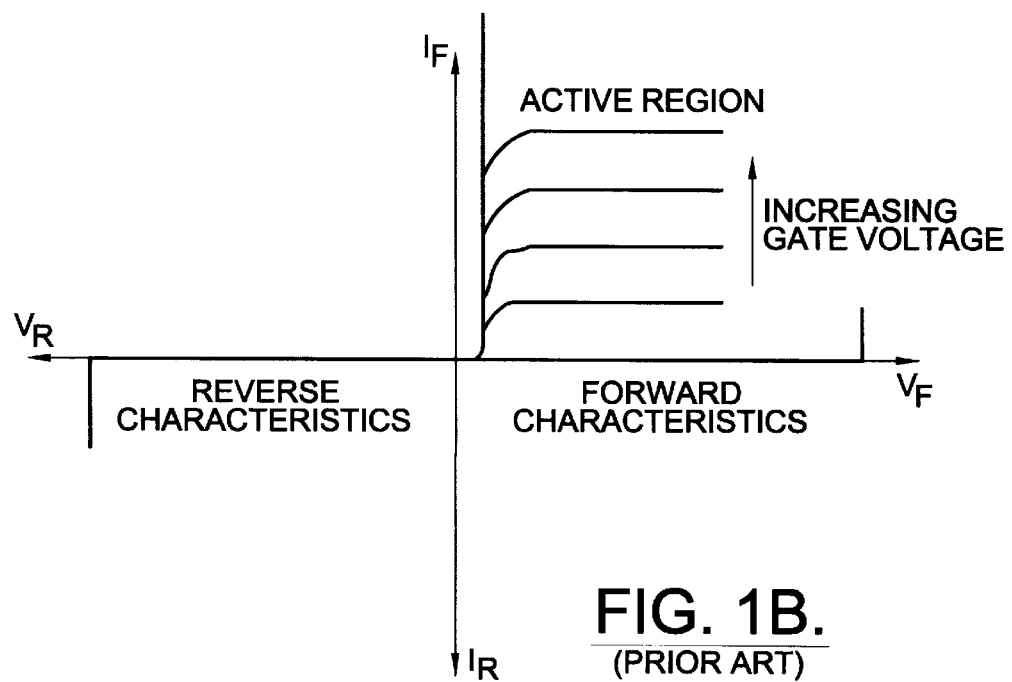
FIG. 1B is a graph of current versus collector voltage for the IGBT of FIG. 1A, at various gate voltages.
Figure 1C:
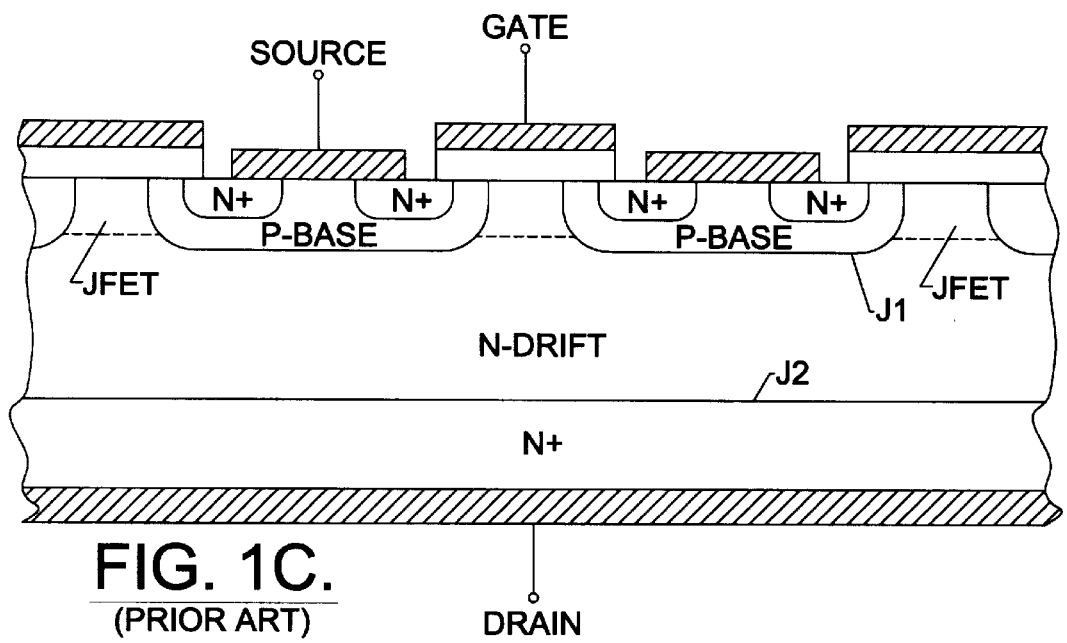
FIG. 1C is a cross-sectional view of a conventional DMOSFET.
Figure 2:
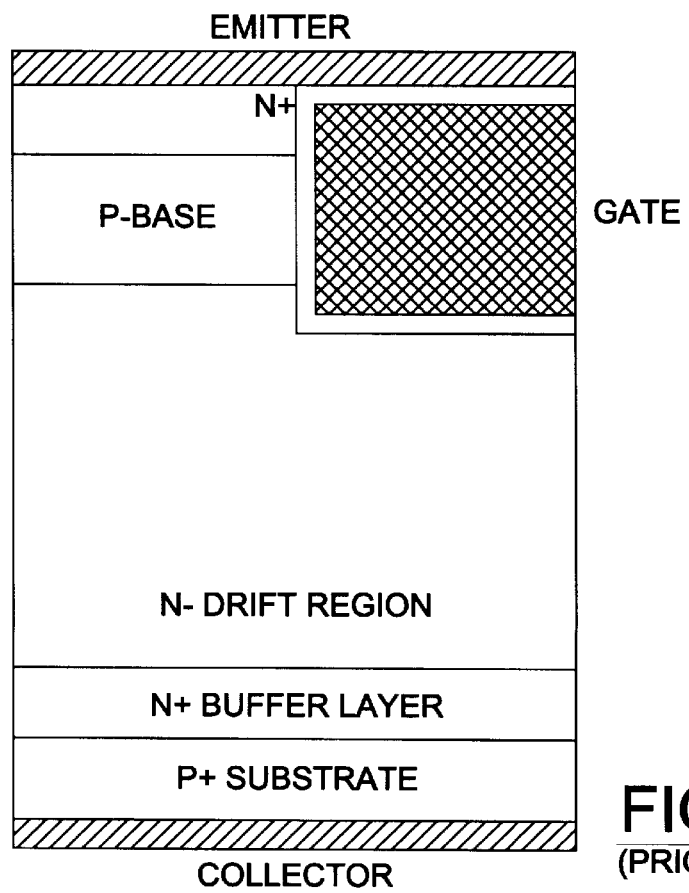
FIG. 2 is cross-sectional view of a conventional DMOS-based vertical IGBT having a trench gate electrode.
Figure 3:
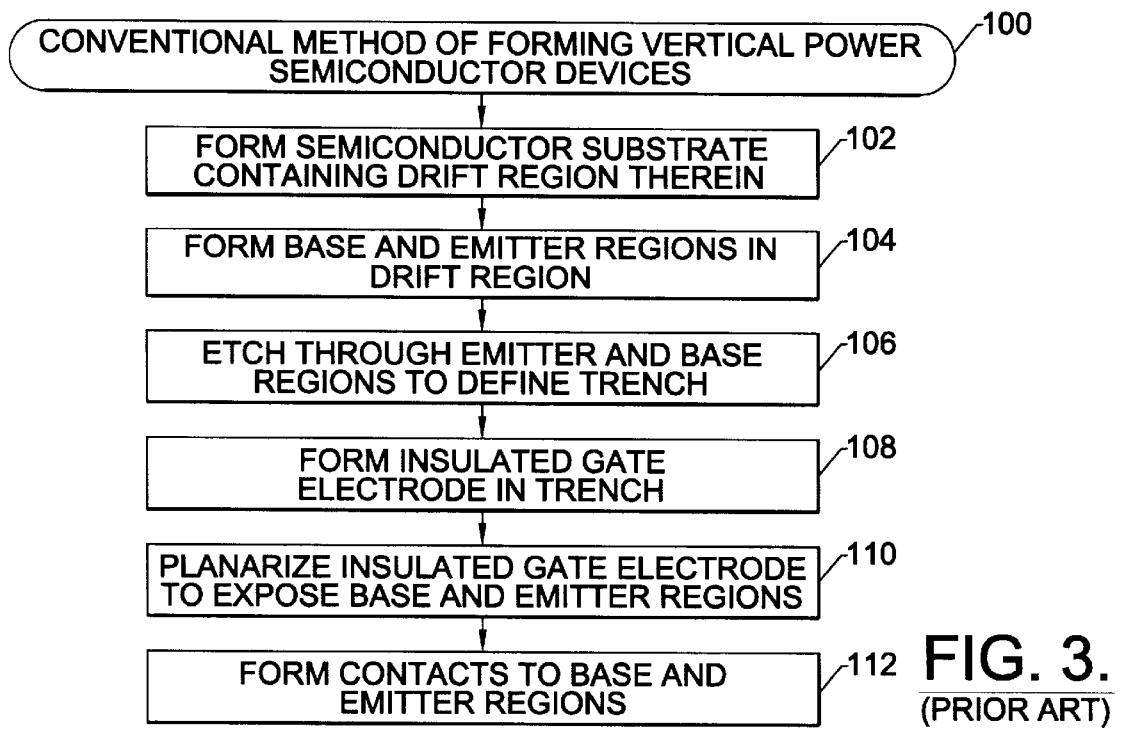
FIG. 3 is a flow diagram of steps which illustrates a conventional method of forming the IGBT of FIG. 2.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawing, the thickness of layers and regions are exaggerated for clarity. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Figure 4:
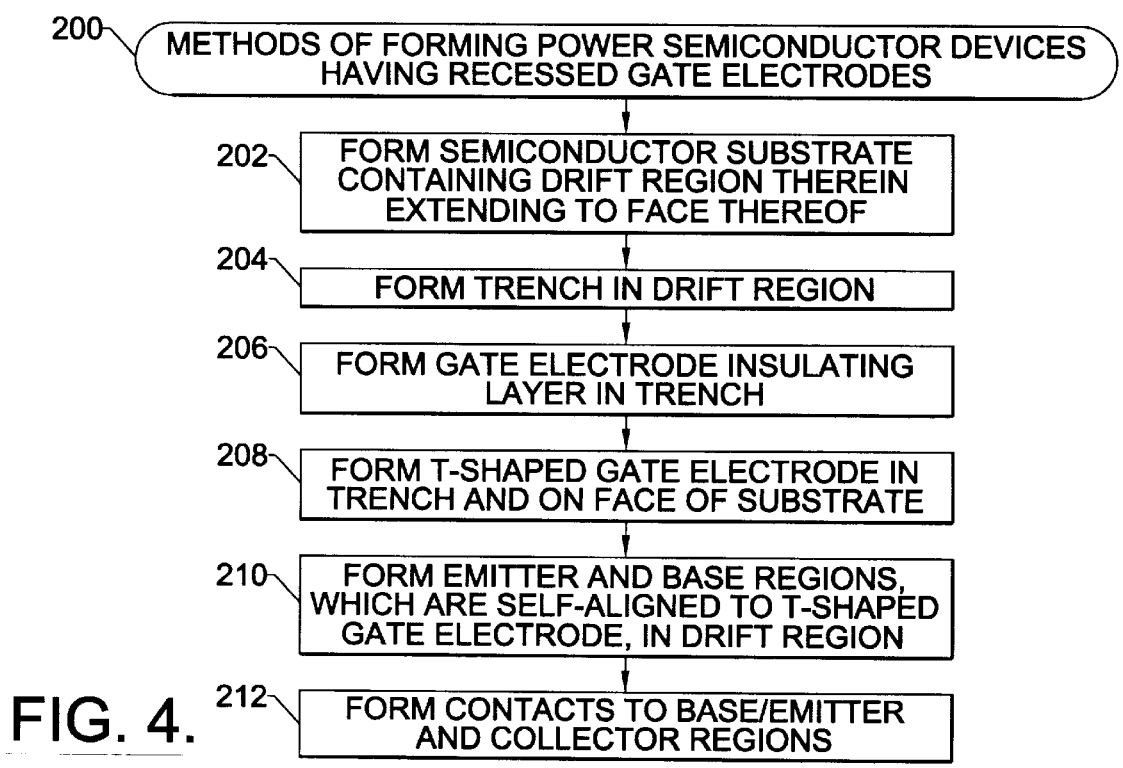
FIG. 4 is a flow diagram of steps which illustrates methods of forming preferred power semiconductor devices according to a first embodiment of the present invention.
Figure 5:
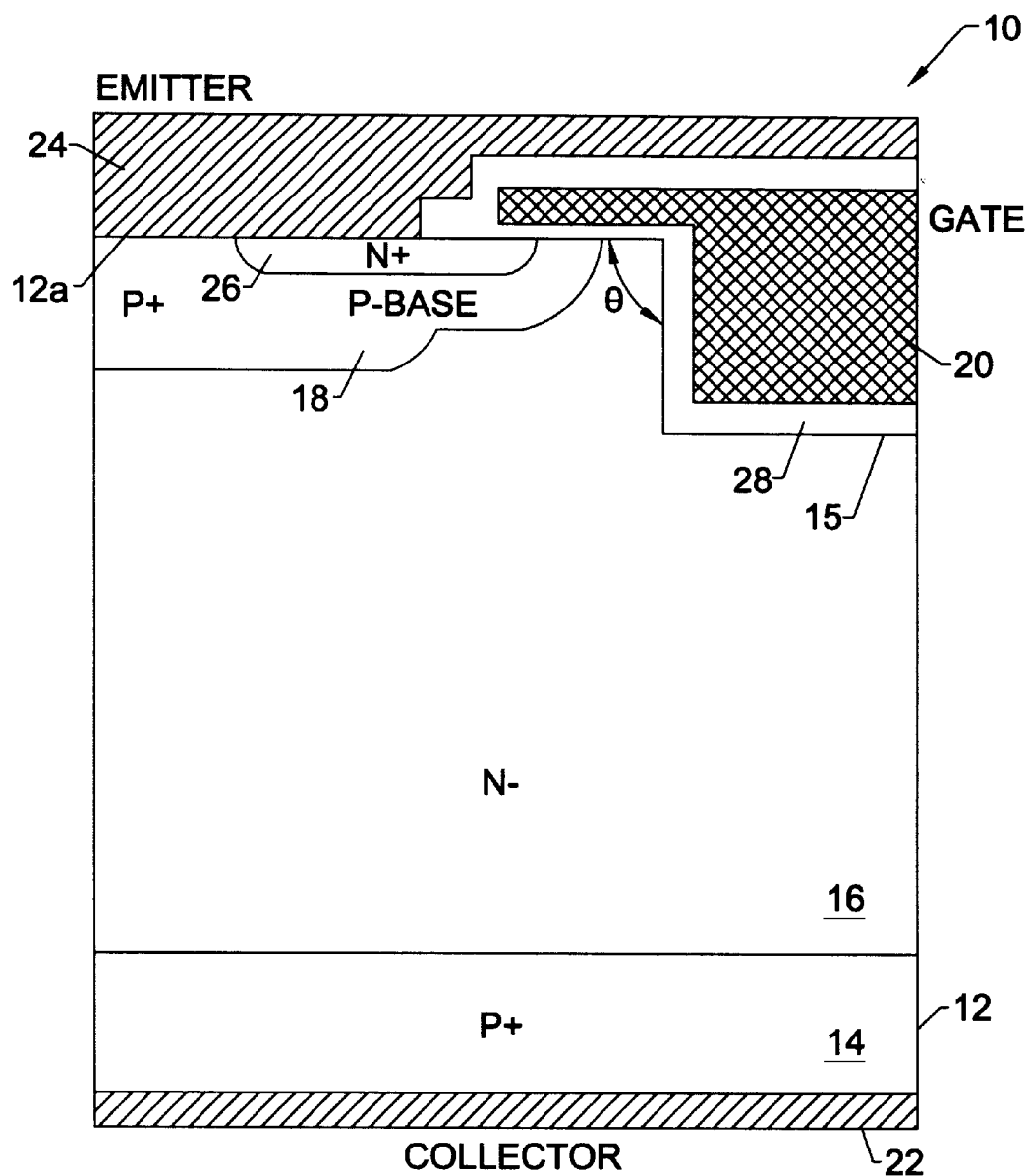
FIG. 5 is a cross-sectional view of a vertical IGBT according to a second embodiment of the present invention.
Figure 6:
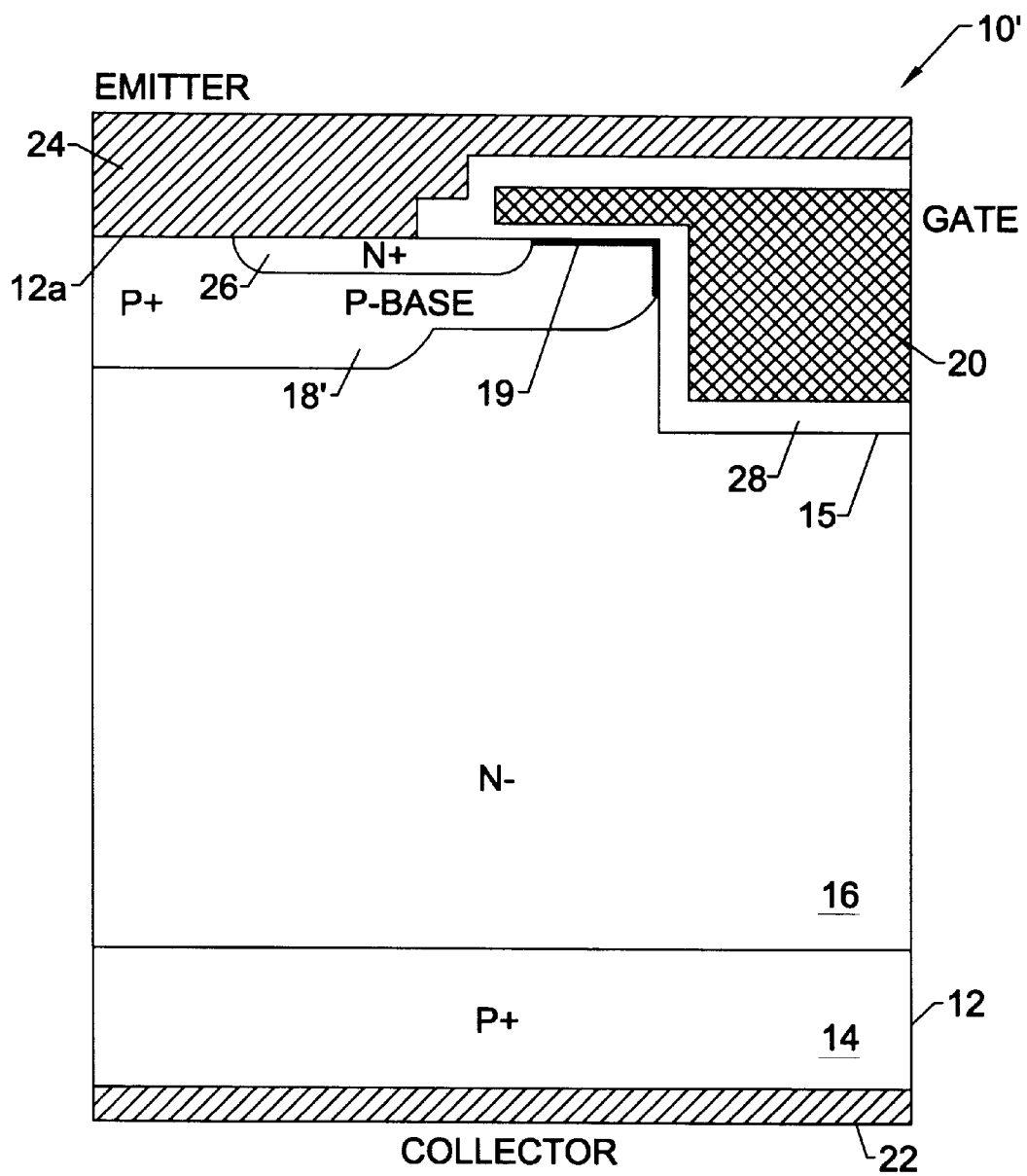
FIG. 6 is a cross-sectional view of a vertical IGBT according to a third embodiment of the present invention.

Referring now to FIGS. 4–6, preferred embodiments of the present invention will be described. In particular, FIG. 4 is a flow diagram of steps which illustrates methods of forming the preferred power semiconductor devices of FIGS. 5 and 6 which have recessed gate electrodes. These methods, Block 200, include the steps of forming a semiconductor substrate 12 having a drift region 16 of first conductivity type (shown as N−) therein extending to a face 12a thereof, Block 202. In the event the power semiconductor devices comprise IGBTs, as illustrated by FIGS. 5–6, the semiconductor substrate 12 preferably includes a collector region 14 of second conductivity type (shown as P+). A highly doped buffer region (not shown) may also be provided between the collector region 14 and drift region 16. As will be understood by those skilled in the art, the buffer region may be provided to inhibit reach-through breakdown. In the event the power semiconductor devices comprise vertical MOSFETs, the substrate 12 may comprise a relatively highly doped drain region (e.g., N+) which forms a nonrectifying junction with the drift region 16. This drift region 16 may be formed as a relatively lightly doped epitaxial layer on a more highly doped N-type or P-type substrate.

The preferred methods also include the step of forming a trench 15 in the substrate so that the trench 15 has a bottom which extends opposite the drift region 16 and a sidewall which extends from the drift region 16 to the face 12a, Block 204. The sidewall of the trench 15 may extend orthogonal to the face 12a or at an angle (θ) less than or greater than 90°. A preferred insulated gate electrode 20 is then formed by lining the face 12a and trench 15 with a gate electrode insulating layer 28, Block 206, and then forming a conductive layer on the gate electrode insulating layer 28. The conductive layer may comprise doped or undoped polysilicon and is preferably formed to extend opposite a portion of the face 12a adjacent to the trench 15 and into the trench 15. A step is then performed to pattern the conductive layer to define-a T-shaped gate electrode 20 (in the event θ=90°) or Y-shaped gate electrode (in the event θ>90°), Block 208. As illustrated, the gate electrode 20 fills the trench 15 and also extends opposite the face 12a at a location adjacent the trench 15. This patterning step is preferably performed without planarizing the conductive layer using techniques such as chemical mechanical polishing (CMP) which may be yield limiting when applied to trench-based devices. In particular, a conventional photolithographically defined etching step can be performed to define an etching mask and then etch the conductive layer and gate electrode insulating layer 28 to expose the face 12a. A relatively short duration thermal oxidation step may also be performed to cover an exposed sidewall and upper surface of the gate electrode 20, as illustrated. Emitter/source and base regions of first and second conductivity type, respectively, are then formed in the drift region 16, Block 210. Preferably, the emitter/source and base regions are formed in a self-aligned manner to an edge of the patterned gate electrode 20. In particular, the emitter/source region 26 and base region 18 may be formed by implanting emitter/source and base region dopants into the drift region 16, using the gate electrode 20 as an implant mask, and then diffusing the implanted dopants to define an emitter/source region 26 within a base region well 18. The diffusion step may also be of sufficient duration to diffuse the base region dopants laterally to the sidewall of the trench 15, as illustrated by the device of FIG. 6. Thus, the application of a gate bias of sufficient magnitude to the gate electrode 20 may result in the formation of an inversion layer channel 19 which extends along the interface between the face 12a of the substrate and the base region 18' and along the interface between the sidewall of the trench 15 and the lateral portion of the base region 18' which extends to the trench 15. Conventional techniques may also be performed to define a highly doped central base contact region (shown as P+) within the base region 18. Contacts 24 and 22 may also be formed to the emitter and base regions 26 and 18 and collector region 14, respectively, Block 212, to complete a vertical IGBT device. Alternatively, in the event the substrate 12 includes a highly doped drain region instead of a collector region, contacts may be formed to the source and base regions and drain region to complete a vertical MOSFET device.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor switching device, comprising the steps of:

forming a semiconductor substrate having a drift region of first conductivity type therein extending adjacent a face thereof;

forming a trench in the substrate, said trench having a bottom that extends adjacent the drift region and a sidewall that extends to the face;

forming a gate electrode insulating layer in the trench;

forming a conductive layer on the substrate, said conductive layer extending opposite a first portion of the face that intersects the sidewall of the trench and onto the gate electrode insulating layer in the trench;

patterning the conductive layer to define a T-shaped gate electrode that fills the trench and also extends opposite the first portion of the face; and forming emitter and base regions of first and second conductivity type, respectively, that are self-aligned to the T-shaped gate electrode and extend in the drift region, by:

implanting emitter and base region dopants into the face using the T-shaped gate electrode as an implant mask; and then simultaneously laterally diffusing the implanted emitter and base region dopants into the drift region for a sufficient duration so that the base region extends to and along the first portion of the face and also extends to and along an upper portion of the sidewall of the trench and the source region extends underneath an edge of the T-shaped gate electrode but does not extend to an intersection between the sidewall of the trench and the first portion of the face.

2. The method of claim 1, wherein said step of forming emitter and base regions comprises implanting emitter and base region dopants into the drift region, using the gate electrode as an implant mask.

3. The method of claim 2, wherein said step of patterning the conductive layer is not preceded by a step of planarizing the conductive layer.

4. The method of claim 2, wherein said step of implanting emitter and base region dopants is not preceded by a step of planarizing the conductive layer.

5. The method of claim 1, wherein said step of forming a gate electrode insulating layer comprises forming a gate electrode insulating layer on the face and on the sidewall and bottom of the trench; and wherein said step of forming emitter and base regions is not preceded by a step of planarizing the conductive layer or a step of planarizing the gate electrode insulating layer.

6. A method of forming a semiconductor switching device, comprising the steps of:

forming a semiconductor substrate having a drift region of first conductivity type therein extending adjacent a face thereof;

forming a trench in the drift region; then forming a T-shaped insulated gate electrode in the trench and on a first portion of the face extending adjacent the trench; and then forming emitter and base regions of first and second conductivity type, respectively, that extend into the drift region and are self-aligned to the T-shaped insulated gate electrode, by:

implanting emitter and base region dopants into the face using the T-shaped insulated gate electrode as an implant mask; and then simultaneously laterally diffusing the implanted emitter and base region dopants into the drift region for a sufficient duration so that the base region extends to and along the first portion of the face and also extends to and along an upper portion of a sidewall of the trench and the source region extends underneath an edge of the T-shaped gate electrode but does not extend to an intersection between the sidewall of the trench and the first portion of the face.

7. The method of claim 6, wherein said step of forming a T-shaped insulated gate electrode comprises:

forming a gate electrode insulating layer on the face and in the trench;

forming an electrically conductive layer on the gate electrode insulating layer so that the electrically conductive layer extends opposite a portion of the face adjacent to the trench and fills the trench; and etching the electrically conductive layer and gate electrode insulating layer to expose the face.

8. The method of claim 7, wherein said step of forming emitter and base regions is not preceded by a step of planarizing the electrically conductive layer.

9. The method of claim 1, wherein said step of simultaneously laterally diffusing the implanted emitter and base region dopants is of sufficiently short duration that a maximum depth to which the base region extends along the upper portion of the sidewall of the trench is less than a maximum depth of the base region relative to the face.

10. The method of claim 6, wherein said step of simultaneously laterally diffusing the implanted emitter and base region dopants is of sufficiently short duration that a maximum depth to which the base region extends along the upper portion of the sidewall of the trench is less than a maximum depth of the base region relative to the face.

11. The method of claim 1, wherein all portions of the T-shaped gate electrode have a T-shaped transverse cross-section.

12. The method of claim 6, wherein all portions of the T-shaped insulated gate electrode have a T-shaped transverse cross-section.

* * * * *